United States Patent
Kirby

(10) Patent No.: US 10,941,612 B2
(45) Date of Patent: Mar. 9, 2021

(54) PHOTOVOLTAIC CELLS ARRANGED IN A PATTERN

(71) Applicant: Lutron Technology Company LLC, Coopersburg, PA (US)

(72) Inventor: David A. Kirby, Zionsville, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 82 days.

(21) Appl. No.: 14/629,534

(22) Filed: Feb. 24, 2015

(65) Prior Publication Data

US 2016/0245016 A1  Aug. 25, 2016

(51) Int. Cl.

| E06B 9/24 | (2006.01) |
|---|---|
| H02J 7/35 | (2006.01) |
| H02J 7/00 | (2006.01) |
| H01L 31/042 | (2014.01) |
| H01L 31/0392 | (2006.01) |
| H02S 20/26 | (2014.01) |

(52) U.S. Cl.
CPC .......... *E06B 9/24* (2013.01); *H01L 31/03928* (2013.01); *H02J 7/35* (2013.01); *H02S 20/26* (2014.12); *E06B 2009/2476* (2013.01); *H02J 7/007* (2013.01); *Y02B 10/10* (2013.01)

(58) Field of Classification Search
CPC ...... H02J 7/00; H02J 7/007; H02J 7/35; H02J 7/355; E06B 9/24; E06B 2009/2476; H01L 31/042
USPC ...................................................... 320/101
See application file for complete search history.

(56) References Cited

U.S. PATENT DOCUMENTS

| 4,328,390 A * | 5/1982 | Meakin ........... H01L 31/022425 136/256 |
|---|---|---|
| 4,419,530 A * | 12/1983 | Nath .............. H01L 31/022425 136/244 |
| 4,443,652 A * | 4/1984 | Izu ........................ H01L 31/076 136/244 |
| 4,487,989 A * | 12/1984 | Wakefield ....... H01L 31/022433 136/256 |
| 4,773,944 A * | 9/1988 | Nath ................. B32B 17/10788 136/249 |
| 5,279,682 A * | 1/1994 | Wald .............. H01L 31/022425 136/256 |
| 5,350,644 A * | 9/1994 | Graetzel ............. H01G 9/2031 429/111 |
| 8,742,249 B2 * | 6/2014 | Moslehi ................ H01L 31/042 136/244 |

(Continued)

OTHER PUBLICATIONS

Andreas Hinsch, Glass Frit Sealed Dye Solar Modules with Adaptable Screen Printed Design, 2006, IEEE, 1-4244-0016-3/06, p. 32-35.*

(Continued)

*Primary Examiner* — Richard Isla
*Assistant Examiner* — Dung V Bui
(74) *Attorney, Agent, or Firm* — Michael Czarnecki; Glen Farbanish; Philip Smith

(57) ABSTRACT

As described herein, a photovoltaic film may include a plurality of photovoltaic cells arranged to form a frit pattern. The photovoltaic film may be affixed to a transparent substrate to form a film-treated panel. The transparent substrate may be glass, such as a windowpane. The photovoltaic cells may be configured to convert sunlight into electrical energy. The electrical energy may be stored and used to power an electrical device.

22 Claims, 10 Drawing Sheets

(56) References Cited

U.S. PATENT DOCUMENTS

| | | | |
|---|---|---|---|
| 2009/0155555 A1* | 6/2009 | Botelho | C03C 8/14 428/210 |
| 2010/0181014 A1* | 7/2010 | Raymond | G02B 5/003 156/209 |
| 2011/0017263 A1* | 1/2011 | Gibson | H01L 31/0543 136/246 |
| 2011/0285942 A1* | 11/2011 | Guo | G02F 1/133516 349/96 |
| 2012/0011782 A1* | 1/2012 | Kolas | E06B 9/264 52/173.3 |
| 2012/0186623 A1* | 7/2012 | Bulovic | H01L 51/4213 136/244 |
| 2013/0057937 A1* | 3/2013 | Berman | E06B 9/68 359/230 |
| 2013/0100675 A1* | 4/2013 | Han | H01L 31/0488 362/253 |
| 2013/0153009 A1* | 6/2013 | Kalkanoglu | H01L 31/18 136/251 |
| 2013/0206219 A1* | 8/2013 | Kurtin | H01L 31/078 136/255 |
| 2013/0206220 A1* | 8/2013 | Cobb | H01L 31/022433 136/256 |
| 2013/0240022 A1* | 9/2013 | Sewell | H01L 31/022441 136/251 |
| 2014/0130864 A1* | 5/2014 | Lunt | E06B 3/66 136/259 |
| 2014/0261630 A1* | 9/2014 | Morgan | H02S 20/32 136/246 |
| 2014/0318611 A1* | 10/2014 | Moslehi | H01L 31/0516 136/256 |
| 2016/0245016 A1* | 8/2016 | Kirby | E06B 9/24 |

OTHER PUBLICATIONS

Hinsch, Andreas—Glass Frit Sealed Dye Solar Modules with Adaptable Screen Printed Design, 2006, IEEE, 1-4244-0016-3/06, p. 32-35.*

* cited by examiner

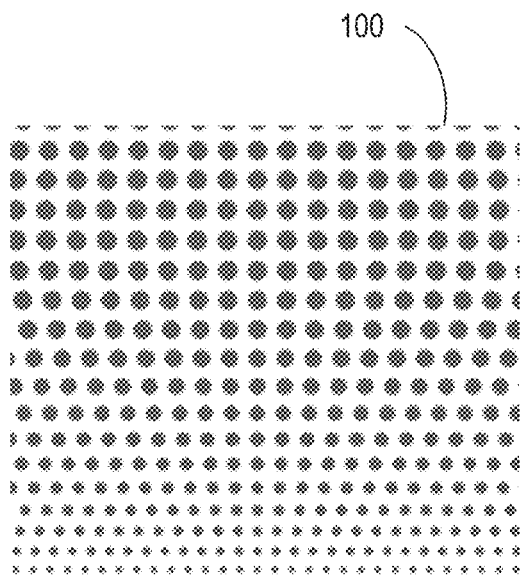 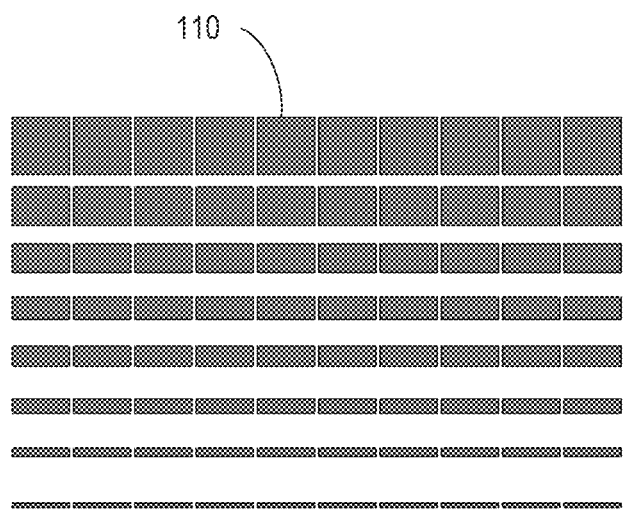
FIG. 1A
PRIOR ART
FIG. 1B
PRIOR ART

PHOTOVOLTAIC CELLS ARRANGED IN A PATTERN

BACKGROUND

Fritted glass panels are well known. A fritted glass panel includes a layer of non-transparent material that is applied on a clear or a tinted glass substrate and may be arranged in a frit pattern. The non-transparent material may be a ceramic frit. A ceramic frit includes small glass particles, a pigment, and a mixing medium. The ceramic frit is applied to one side of the glass panel, which is fired in a furnace.

The frit pattern of a fritted glass panel may include an arrangement of dots, lines, holes, blocks, or other geometric shapes. The frit pattern may be arranged consistently across the glass panel or may vary across the glass panel. A graduated frit pattern is an example of a varied frit pattern. In a graduated frit pattern, larger shapes transition to smaller shapes gradually across the glass panel resulting in a greater amount of surface area being covered by the non-transparent material at the top of the glass panel than at the bottom of the glass panel.

Fritted glass panels enable the reduction of the energy consumption of electrical loads, such as lighting loads and heating, ventilation, and air-conditioning (HVAC) equipment loads, by diffusing sunlight and reducing solar heat gain. Fritted glass panels diffuse the sunlight while maintaining good views through the fitted glass panel. Fritted glass reduces glare from direct and/or indirect sunlight. Unlike tinted glass, fritted glass may not change the color of the sunlight entering a space. Fritted glass has various uses including commercial buildings, residential buildings, and automobiles, for example.

Prior art fritted glass panels do not take advantage of the sunlight energy incident on the fitted glass panel. The prior art fritted glass panels simply block a certain percentage of sunlight energy from passing through the fitted glass panel. However, being able to block and also harness the blocked sunlight energy may be desirable.

SUMMARY

As described herein, a photovoltaic film may include a plurality of photovoltaic cells arranged in a frit pattern on a transparent planar structure. The photovoltaic film may be affixed to a transparent substrate to form a film-treated panel. The transparent substrate may be a glass substrate, such as a windowpane. The photovoltaic cells may be configured to convert sunlight into electrical energy. The electrical energy may be stored and/or used to power an electrical device, such as a motorized window treatment, a sensor, or the like.

The photovoltaic film may include transparent and non-transparent portions. The non-transparent portions may be the photovoltaic cells. The photovoltaic cells may have various geometric shapes, such as dots or rectangles, for example. The geometric shapes may vary in size across the photovoltaic film to block different amounts of sunlight across the photovoltaic film. For example, the photovoltaic cells may be arranged in a frit pattern that includes a plurality of dots that vary in diameter from a first diameter at a first position on the photovoltaic film to a second diameter at a second position on the photovoltaic film.

The photovoltaic cells of the photovoltaic film may charge an energy storage device that may be electrically connected to the photovoltaic cells. The energy stored in the energy storage device may be used to power an electrical device, such as a motorized window treatment, a sensor, or the like. The photovoltaic cells of the photovoltaic film may produce an electrical output. The photovoltaic cells may be arranged in one or more zones. Each zone may produce an independent electrical output.

BRIEF DESCRIPTION OF THE DRAWINGS

FIG. 1A is an example prior art frit pattern with dots of varying diameter.

FIG. 1B is an example prior art frit pattern with rectangles of varying size.

DETAILED DESCRIPTION

FIG. 1A and FIG. 1B illustrate example prior art frit patterns 100, 110 for fritted glass panels. As shown, the frit patterns may feature geometric shapes such as rectangles or dots, for example, or any combination of geometric shapes. The size of the geometric shapes may be constant throughout the frit pattern. The size of the geometric shapes may vary across the frit pattern. The example frit pattern 100 shown in FIG. 1A includes a plurality of dots. The dots may vary in diameter from one position on the frit pattern 100 to another position on the frit pattern 100. For example, the frit pattern 100 may include a first dot with a first diameter at a first position and a second dot with a second diameter at a second position. The first diameter may be different than the second diameter. The example frit pattern 110 shown in FIG. 1B includes a plurality of rectangles. The rectangles may vary in size (e.g., width, length, or surface area) from a first position on the frit pattern 110 to a second position on the frit pattern 110. For example, the frit pattern 110 may include a first rectangle with a first surface area at the first position and a second rectangle with a second surface area at the second position. The first surface area may be different than the second surface area. The spacing between the geometric shapes may vary across the frit pattern. For example, the spacing between the dots and/or rectangles, as respectively shown in FIG. 1A and FIG. 1B, vary across the frit pattern.

The frit pattern may be affixed to a glass substrate, such as a glass panel or a windowpane. The spacing between the geometric shapes of the frit pattern may provide more transparent area in certain areas of the glass substrate and less transparent area in other areas of the glass substrate. The frit pattern 100, 110 may cover the entire glass substrate or a portion of the glass substrate.

Frit patterns may be arranged on windowpanes in exterior windows that separate an interior space from the environment. Frit patterns may be used in interior applications such as, privacy glass panels, space dividers, or decorative panels. The frit patterns may be customized for the intended application.

Figure 2:
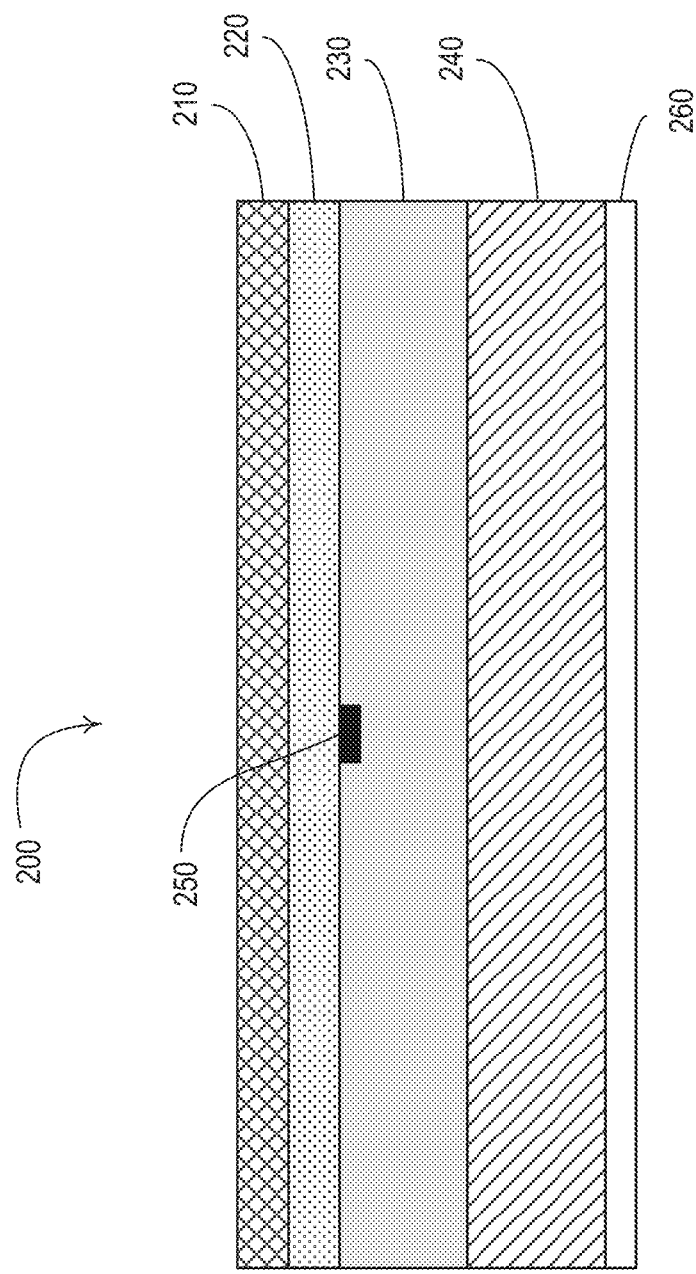
FIG. 2 is a simplified cross section of a prior art photovoltaic cell.

FIG. 2 illustrates a simplified cross section of an example prior art photovoltaic cell. A photovoltaic cell converts solar energy into electrical energy. Prior art photovoltaic cells are manufactured from a variety of materials. Referring to FIG. 2, an example photovoltaic cell 200 includes a cover plate 210, an anti-reflection coating 220, an n-type semiconductor 230, a p-type semiconductor 240, a front electrical contact 250, and a back electrical contact 260. The photovoltaic cell 200 may include a grid of front electrical contacts 250 that do not cover a large portion of the surface area of the n-type semiconductor 230, such that the n-type semiconductor 230 may be exposed to sunlight. When exposed to sunlight, photons from the sunlight dislodge electrons in the p-type semiconductor 240, which jump to holes in the n-type semiconductor 230. As the dislodged electrons move from the p-type semiconductor 240 to the n-type semiconductor 230, current flows from the front electrical contact 250 to the rear electrical contact 260. This current may be used to charge an energy storage device (e.g., a battery or capacitor) and/or power an electrical device.

The n-type semiconductor 220 and p-type semiconductor 230 in traditional photovoltaic cells are silicon. Because silicon is a reflective metal, photons may reflect off of the silicon before dislodging an electron. The anti-reflection coating 210 reduces the reflectiveness of the silicon and may increase the likelihood that a photon will dislodge an electron. The cover plate 200 protects the photovoltaic cell from damage and may be positioned to be exposed to sunlight. The cover plate 200 may include glass, plastic, or a metal coated with a transparent conducting oxide. The back contact 240 creates a conductor for the flow of electrons and may be coupled to the energy storage device and/or the powered electrical device.

Figure 3:
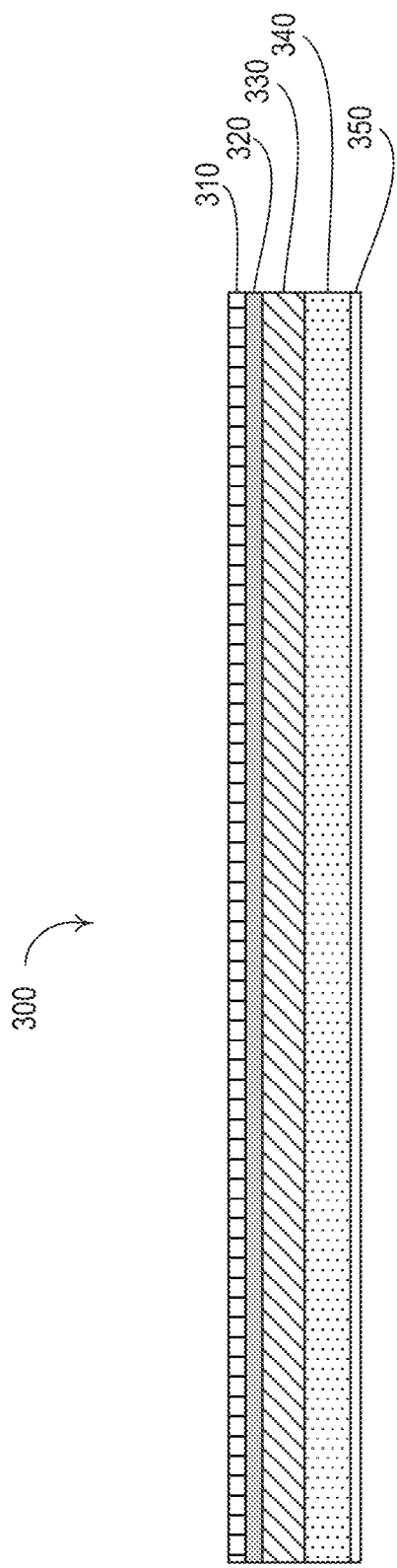
FIG. 3 is a cross section of an example prior art thin-film photovoltaic cell.

FIG. 3 depicts an example prior art thin-film photovoltaic cell 300. The thin-film photovoltaic cell 300 may include thin semiconductor layers that can efficiently absorb sunlight energy. A thin-film photovoltaic cell semiconductor (e.g., a p-type semiconductor or an n-type semiconductor) may include amorphous silicon (a-Si), cadmium telluride (CdTe), cadmium sulfide (CdS), or copper indium gallium deselenide (CIGS). Referring to FIG. 3, an example thin-film photovoltaic cell 300 having a CIGS semiconductor may include a first electrical contact 310 (e.g., a zinc oxide or molybdenum electrode layer), a CdS p-type semiconductor layer 320, a CIGS n-type semiconductor layer 330, a second electrical contact 340 (e.g., a zinc oxide or molybdenum electrode layer), and a substrate layer 350. When exposed to sunlight, photons from the sunlight dislodge electrons in the p-type semiconductor layer 320, which jump to holes in the n-type semi-conductor layer 330. As the dislodged electrons move from the p-type semiconductor layer 320 to the n-type semiconductor layer 330, a current flows from the first electrical contact 310 to the second electrical contact 340. This current may be used to charge an energy storage device (e.g., a battery or capacitor) and/or power an electrical device. The substrate layer 350 protects the thin-film photovoltaic cell 300 from damage. The substrate layer 350 may include glass, plastic, or a metal.

Figure 4A:
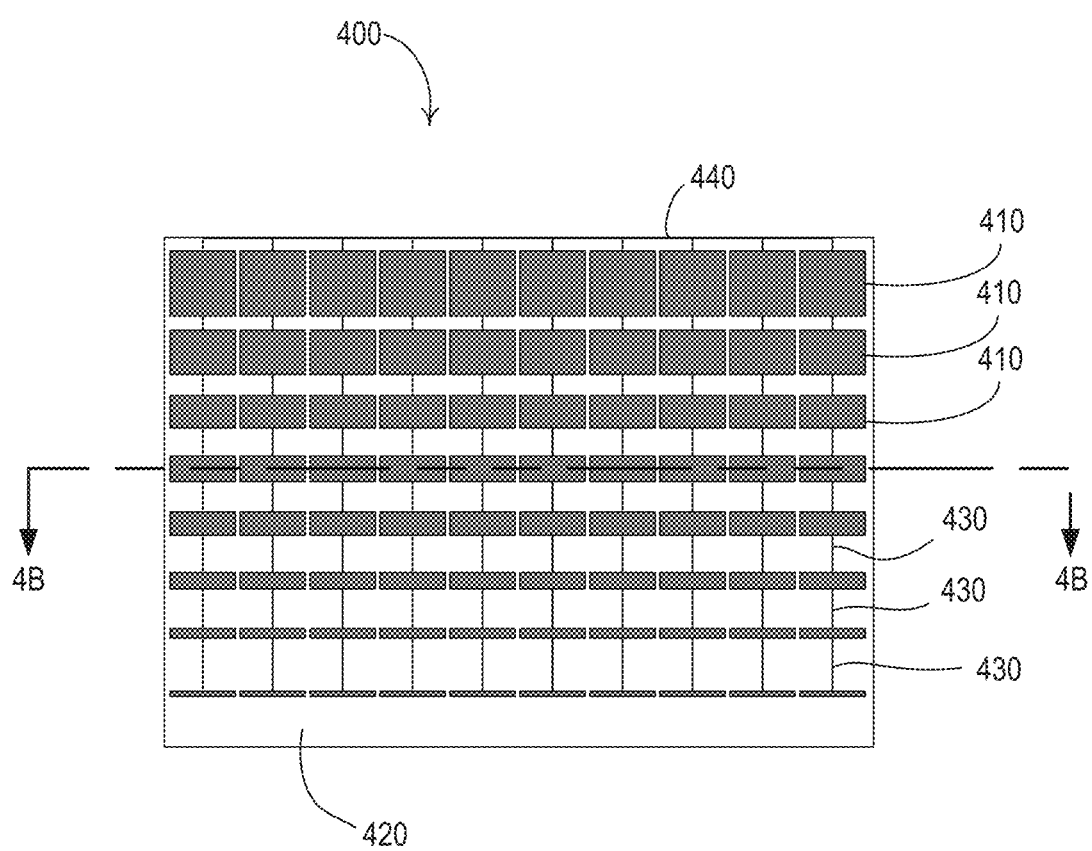
FIG. 4A is an example photovoltaic film having a plurality of photovoltaic cells arranged in a frit pattern.

FIG. 4A is an example front view of a photovoltaic film 400 having a plurality of photovoltaic cells 410 arranged in a frit pattern on a transparent planar structure, such as a transparent sheet 420. The transparent sheet 420 may be rectangular, or any suitable shape for supporting the photovoltaic cells 410 for affixing the photovoltaic film 400 to a flat surface (e.g., a window). The photovoltaic cells 410 may be thin-film photovoltaic cells, for example, as described herein, and may be non-transparent. For example, the photovoltaic cells 410 may be arranged on the transparent sheet 420 to form the frit pattern 110 depicted in FIG. 1B. The spacing between the photovoltaic cells 410 may be constant or may vary across the photovoltaic film 400. The photovoltaic film 400 may include non-transparent portions (e.g., one or more standard frits).

The photovoltaic cells 410 may be electrically coupled together via electrical connections 430 and may be connected in series or parallel. The electrical connections 430 may extend vertically between the photovoltaic cells 410 (e.g., as shown in FIG. 4A), may extend horizontally between the photovoltaic cells, or may form a grid pattern between the photovoltaic cells. For example, if the photovoltaic cells 410 are connected in parallel, the electrical connections 430 shown in FIG. 4A may each represent first and second electrical conductors, where the first electrical conductor electrically connects the positive contacts (e.g., the back electrical contacts 260 or the first electrical contacts 310) of two adjacent photovoltaic cells, and the second electrical conductor electrically connects the negative contacts (e.g., the front electrical contacts 250 or the second electrical contacts 340) of the two adjacent photovoltaic cells. The photovoltaic film 400 may produce an electrical output (e.g., to the positive and negative contacts of the photovoltaic cells 410). For example, if the photovoltaic cells 410 are connected in parallel, the electrical output may be provided at an uppermost electrical connection 440 as shown in FIG. 4A. If the photovoltaic cells 410 are connected in series, the positive contact (e.g., the back electrical contact 260 or the first electrical contact 310) of one photovoltaic cell may be electrically connected to the negative contact (e.g., the front electrical contact 250 or the second electrical contact 340) of an adjacent photovoltaic cell. For example, the photovoltaic cells 410 of a column (e.g., as shown in FIG. 4A) may be electrically connected in series, and the columns of series-connected photovoltaic cells may be electrically connected in parallel.

Figure 4B:
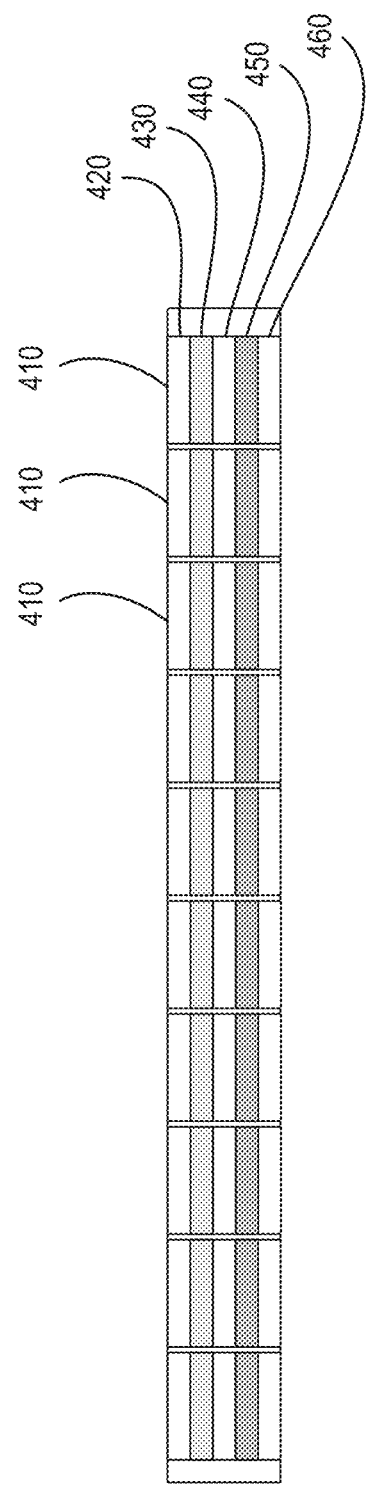
FIG. 4B is a section view of the example photovoltaic film shown in FIG. 4A.

FIG. 4B is a section view of the example photovoltaic film shown in FIG. 4A. The thin-film photovoltaic cells 410 of the photovoltaic film 400 may be arranged to form the frit pattern. The thin-film photovoltaic cells 410 may convert sunlight energy into electrical energy. Each thin-film photovoltaic cell 410 includes multiple layers, and may include a first electrical contact 410 (e.g., a first electrode layer), a p-type semiconductor 420, an n-type semiconductor 430, a second electrical contact 440 (e.g., a second electrode layer), and a substrate layer 450. When exposed to sunlight, photons from the sunlight dislodge electrons in the p-type semiconductor layer 420, which jump to holes in the n-type semi-conductor layer 430. As the dislodged electrons move from the p-type semiconductor layer 420 to the n-type semiconductor layer 430, a current flows from the first electrical contact 410 to the second electrical contact 440. This current may be used to charge an energy storage (e.g., a battery or capacitor) and/or power an electrical device. The substrate layer 450 protects the thin-film photovoltaic cells 410 from damage. The substrate layer 450 of the thin-film photovoltaic cells 410 may include glass, plastic, or a metal.

Figure 5:
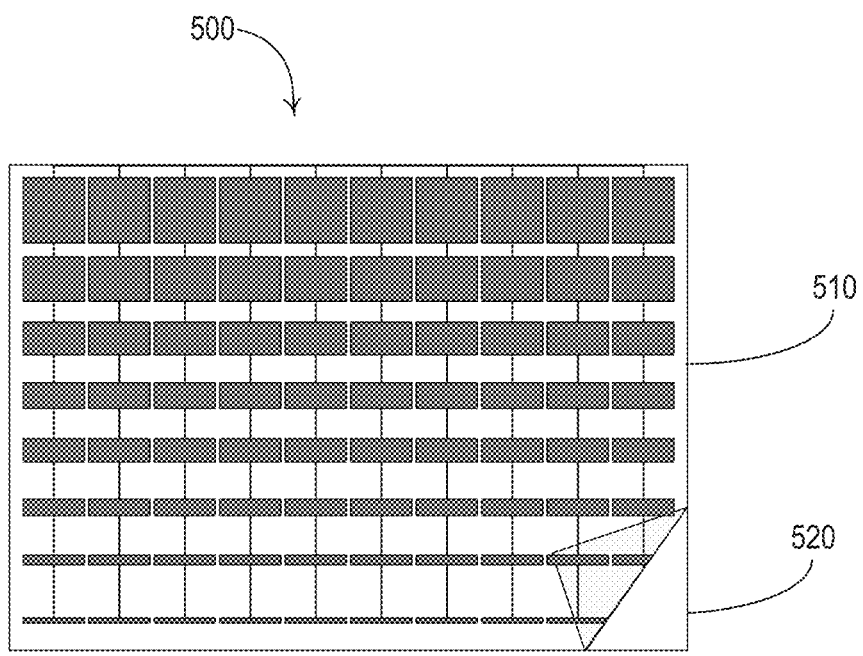
FIG. 5 is an illustration of an example photovoltaic film affixed to a transparent substrate.

FIG. 5 depicts an example film-treated panel 500 having a photovoltaic film 510 affixed to a transparent substrate 520. The transparent substrate 520 may be a glass panel, such as a windowpane. The photovoltaic film 510 may be affixed to the transparent substrate 520 to form a film-treated panel. The photovoltaic film 510 may be an example of the photovoltaic film 400 shown in FIG. 4A and FIG. 4B. The photovoltaic film 510 may include one or more thin-film photovoltaic cells arranged in a frit pattern. The photovoltaic film 510 may be affixed to the entire transparent substrate 520 or to only a portion of the transparent substrate 520. The photovoltaic film 510 may be affixed to the transparent substrate 520 using an adhesive agent, which may include double sided tape, polydimethylsiloxane (PDMS), or the like.

Figure 6A:
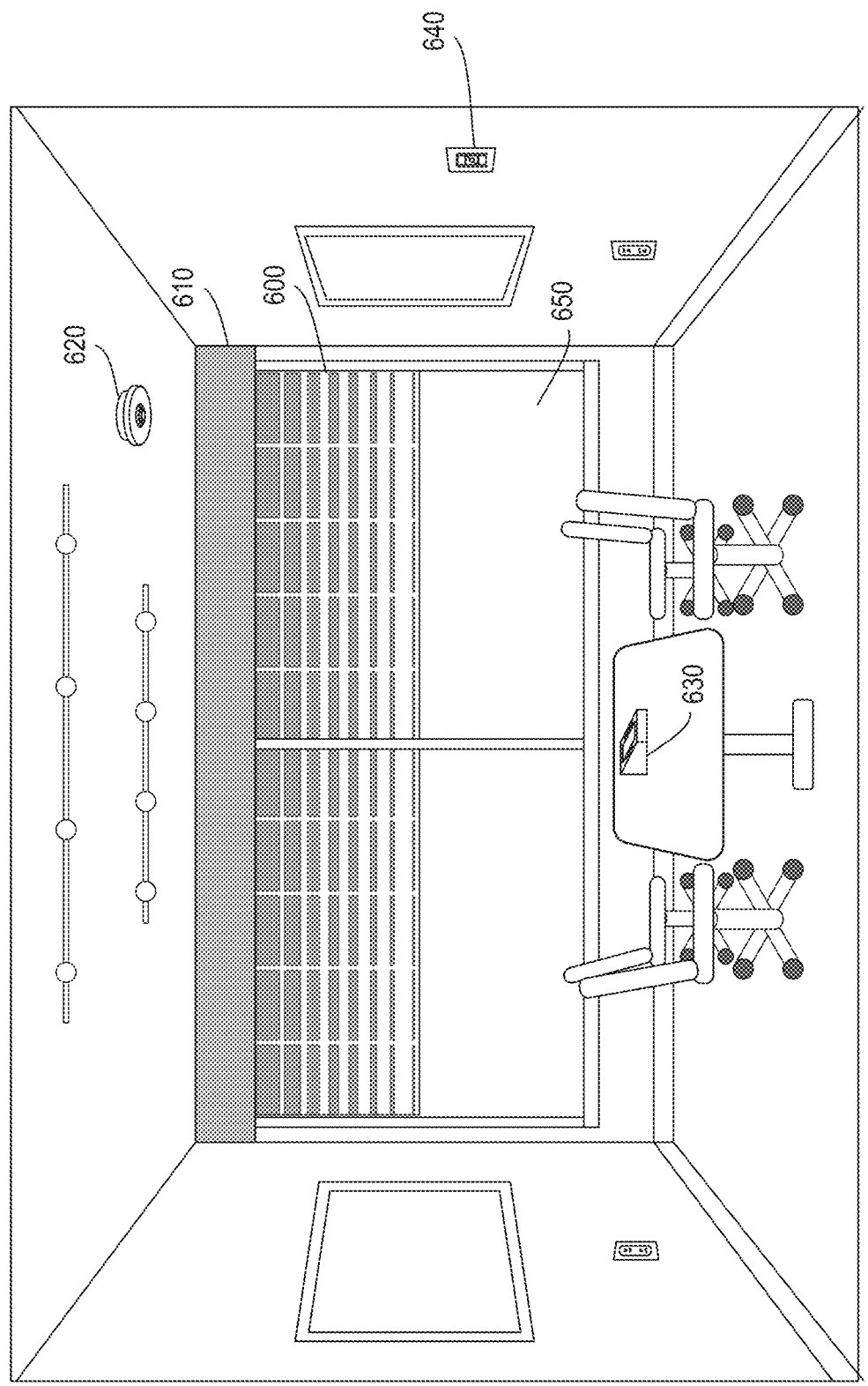
FIG. 6A is an example window treatment system having a motorized window treatment for controlling an amount of daylight entering a space through a glass substrate to which a photovoltaic film is affixed.

FIG. 6A is an example window treatment system having a motorized window treatment 610 for controlling an amount of daylight entering a space through a glass substrate, e.g., a windowpane 650. A photovoltaic film 600 (e.g., the photovoltaic film 400 and/or the photovoltaic film 510) may be affixed to the windowpane 650. The photovoltaic film 600 may be a smaller size than the windowpane 650 and may be affixed to only a portion of the windowpane 650. The photovoltaic film 600 may cover the entire windowpane 650. For example, the photovoltaic film 600 may be affixed to a top portion of the windowpane 650, as shown in FIG. 6A.

As described herein, the photovoltaic cells of the photovoltaic film 600 may produce an electrical output, which may be used to power a control device, such as the motorized window treatment 610, a remote control device, a lighting control device, a panaboard, or a sensor 620, for example. The sensor 620 may be a daylight sensor, an occupancy sensor, a window sensor (e.g., a glare sensor, a shadow sensor, a cloudy-day sensor, etc.), or the like. The electrical output of the photovoltaic film 600 may be used to power a controlled device, such as a motorized window treatment 610, for example. The motorized window treatment 610 may include motorized shades, motorized blinds, or the like. The electrical output of the photovoltaic film 600 may be electrically connected to an energy storage device (e.g., a battery or a capacitor). The energy storage device may store electrical energy harnessed by the photovoltaic cells in the photovoltaic film 600. The energy storage device may be electrically connected to one or more devices. The stored electrical energy may power the one or more devices. The electrical output of the photovoltaic film 600 may be sent to an external utility power grid.

The motorized window treatment 610 may be controlled by one or more control devices, such as, a wall-mounted remote control device 640 or a tabletop remote control device 630. The wall-mounted remote control device 640 or the tabletop remote control device 630 may transmit one or more control signals (e.g., wireless signals) to the motorized window treatment 610. The motorized window treatment 610 may use power from the electrical output of the photovoltaic film 600 or the energy storage device to operate in response to the control signals.

The photovoltaic film 600 may be further configured to detect, sense, and/or measure environmental characteristics. For example, the photovoltaic film 600 may be configured to detect, sense, and/or measure a daylight intensity, an occupancy condition, a shadow, a glare condition, or the like. The control device may use the harnessed information regarding the environmental characteristics to control devices such as the motorized window treatment 610, for example.

The photovoltaic film 600 may be configured as a daylight sensor. The photovoltaic film 600 may measure the amount of daylight entering a space. The motorized window treatment 610 may be controlled to achieve a desired light intensity in the space based on the measured daylight. For example, the motorized window treatment 610 may be adjusted such that the covering material is raised when the measured daylight decreases. As another example, the motorized window treatment may be adjusted such that the covering material is lowered when the measured daylight increases.

The photovoltaic film 600 may be configured as a window sensor (e.g., a glare sensor, a shadow sensor, a cloudy-day sensor, or the like). The electrical output of the photovoltaic film 600 may indicate the presence of a shadow and/or glare on the windowpane 650. For example, the control device may determine the presence of a shadow on the windowpane 650 by sensing a change in voltage on an electrical output of the photovoltaic film 600. As the surface area of the windowpane 650 covered by a shadow increases, the electrical output produced by the photovoltaic cells in the photovoltaic film 600 may decrease, for example, decrease proportionally. The motorized window treatment 610 may be controlled based on the presence of a shadow (e.g., to improve the view out of the window). The photovoltaic film 600 may detect a glare (e.g., a source of intense glare). The detected glare may be caused, for example, by the sun shining off of an adjacent building. The motorized window treatment 610 may be controlled based on the detected glare. For example, the covering material of the window treatment 610 may be lowered to limit the glare (e.g., limit the effect of the glare on occupants of the space). Examples of controlling motorized window treatments in response to window sensors are described in greater detail in commonly-assigned U.S. Patent Application No. 2014/0262057, published Sep. 18, 2014, entitled METHOD OF CONTROLLING A WINDOW TREATMENT USING A LIGHT SENSOR, the entire disclosure of which is hereby incorporated by reference.

The photovoltaic film 600 may have an occupancy sensing circuit (e.g., an occupancy sensor) embedded in the film. The occupancy sensing circuit may generate a control signal when motion is detected in the space. The control signal may be provided to a control device such as the motorized window treatment 610 or a lighting control device, for example. Examples of occupancy sensors are described in greater detail in commonly-assigned U.S. Pat. No. 8,009,042, issued Aug. 30, 2011 Sep. 3, 2008, entitled RADIO-FREQUENCY LIGHTING CONTROL SYSTEM WITH OCCUPANCY SENSING, and U.S. Pat. No. 8,228,184, issued Jul. 24, 2012, entitled BATTERY-POWERED OCCUPANCY SENSOR, the entire disclosures of which are hereby incorporated by reference.

Figure 6B:
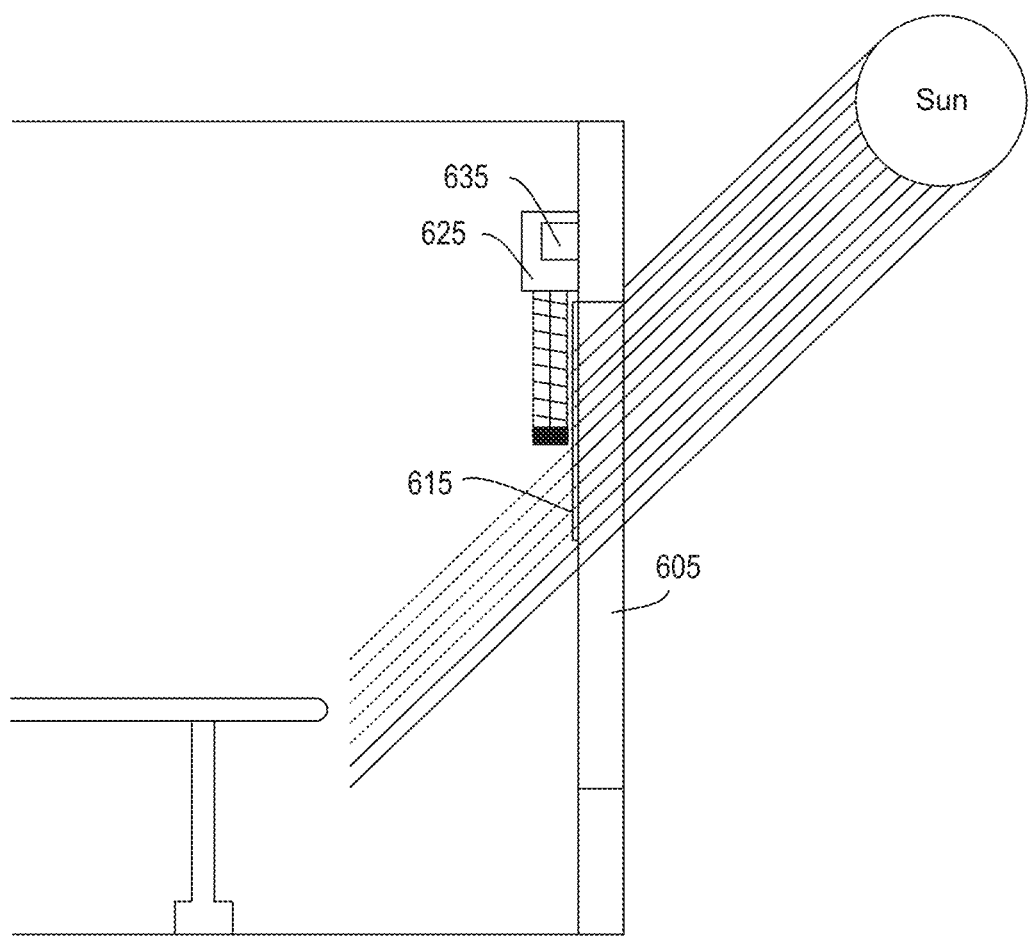
FIG. 6B and FIG. 6C are cross section views of an example window treatment system having a motorized window treatment for controlling an amount of daylight entering a space through a glass substrate.
Figure 6C:
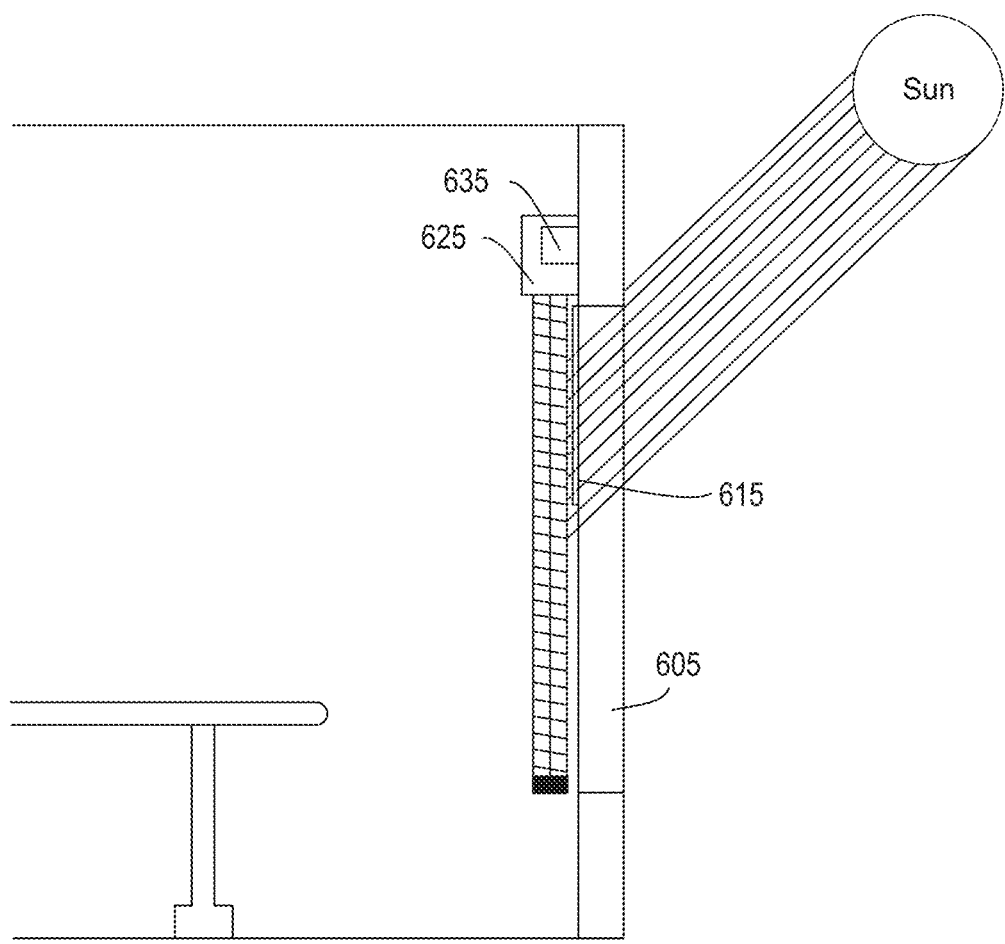

FIG. 6B and FIG. 6C are cross section views of an example window treatment system having a motorized window treatment 625 for controlling an amount of daylight entering a space through a glass substrate, e.g., a windowpane 605. A photovoltaic film 615 (e.g., the photovoltaic film 400, the photovoltaic film 510, and/or the photovoltaic film 600) may be affixed to the windowpane 605. The photovoltaic film 615 may be a smaller size than the windowpane 605 and may be affixed to a portion of the windowpane 605. For example, the photovoltaic film 615 may be affixed to a top portion of the windowpane 605. The photovoltaic film 615 may prevent more sunlight from entering the room from the top of the windowpane 605 than at the bottom of the windowpane 605.

Sunlight may pass through the windowpane 605 and may be incident on the photovoltaic film 615. As shown, a portion of the sunlight passes through the photovoltaic film 615 and may be incident on the motorized window treatment 625. The motorized window treatment 625 may be partially extended. When partially or fully extended, the motorized window treatment 625 may block or filter sunlight from the portion of the windowpane 605 and photovoltaic film 615 that is incident on the motorized window treatment 625. When the motorized window treatment 625 is partially extended, sunlight may enter the room below the motorized window treatment 625, as shown.

A control device may sense that sunlight is entering the room or that sunlight is incident on the entire windowpane 605. As shown in FIG. 6C, the motorized window treatment 625 may be operated to extend to a fully extended position that prevents any sunlight, which passes through the windowpane 605 and the photovoltaic film 615, from entering the room. As shown in FIG. 6B, the motorized window treatment 625 may be operated to retract to a partially extended position or a fully retracted position, for example when sunlight is not incident on the windowpane 605 or full view through the windowpane 605 is desired. The motorized window treatment 625 may receive a signal to operate or may operate automatically.

Figure 7:
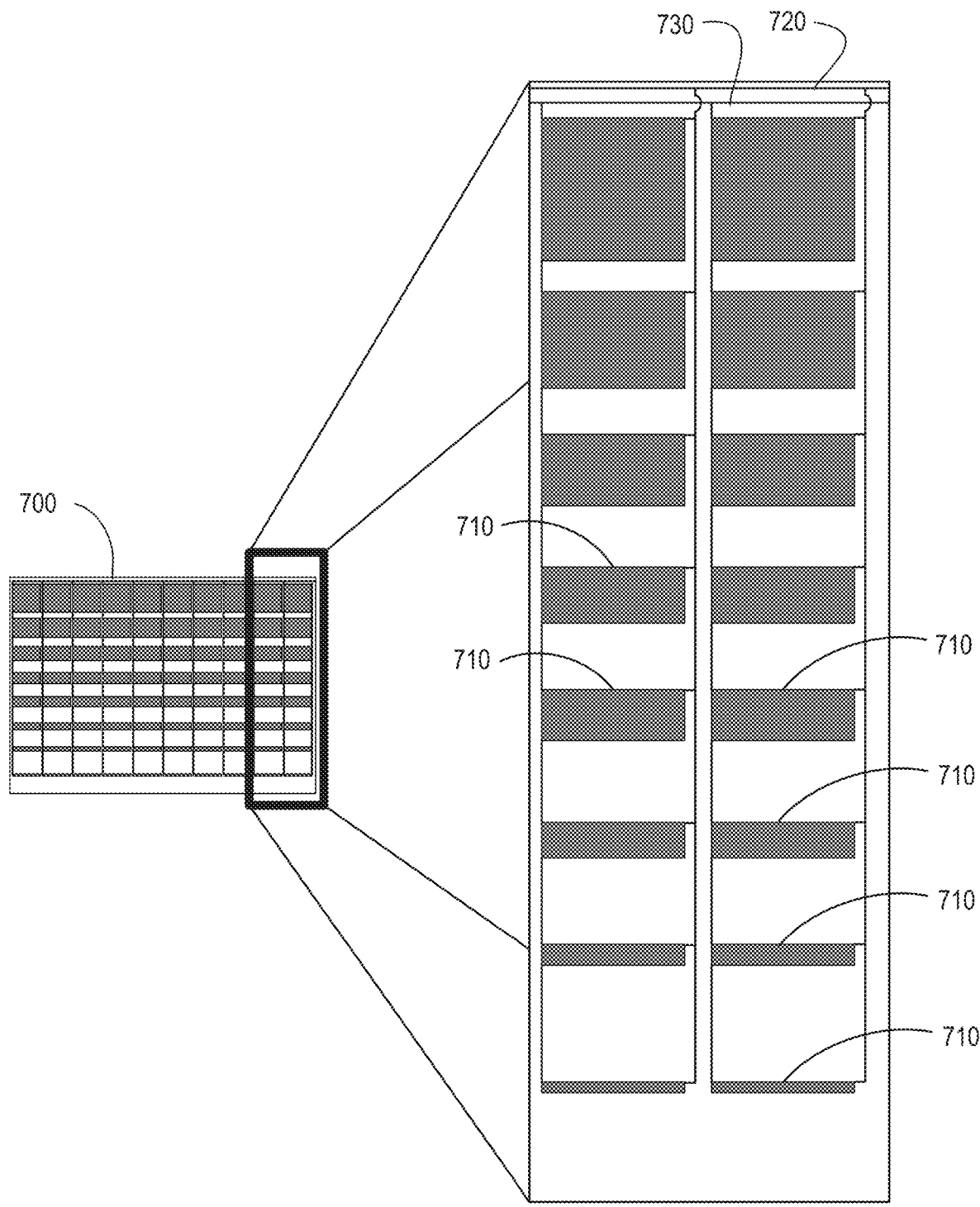
FIG. 7 depicts an example wiring configuration for the example photovoltaic film shown in FIG. 4A.

FIG. 7 illustrates an example wiring configuration for the example photovoltaic film. The photovoltaic film 700 may include a plurality of photovoltaic cells 710. The plurality of photovoltaic cells 710 may be thin-film photovoltaic cells, for example. The electrical output of the photovoltaic film may be a single output (e.g., a combined output) that includes the current produced by each of the plurality of photovoltaic cells 710. The photovoltaic film 700 may include two or more electrical outputs, which may be based on two or more zones of photovoltaic cells 710. Each of the plurality of photovoltaic cells 710 may be wired to a positive conductor 720 and a negative conductor 730. For example, the positive contact (e.g., the back electrical contact 260 or the first electrical contact 310) of each of the photovoltaic cells 710 may be coupled to the positive conductor 720 and the negative contact (e.g., the front electrical contact 250 or the second electrical contact 320) of each of the photovoltaic cells may be coupled to the negative conductor 730, such that the plurality of photovoltaic cells 710 are wired in parallel. The plurality of photovoltaic cells 710 may also be wired in series, where a front electrical contact of a first photovoltaic cell may be wired to a rear electrical contact of a second photovoltaic cell (which is adjacent to the first photovoltaic cell) and a front electrical contact of the second photovoltaic cell may be wired to a rear electrical contact of a third photovoltaic cell (which is adjacent to the second photovoltaic cell), and so on.

The invention claimed is:

1. A photovoltaic film, comprising:
a transparent planar structure; and
a plurality of photovoltaic cells arranged in a pattern on the transparent planar structure, wherein the plurality of photovoltaic cells are non-transparent, further wherein the plurality of photovoltaic cells are configured to convert sunlight into electrical energy;
wherein the pattern comprises:
a first subset of two or more of the plurality of photovoltaic cells linearly disposed adjacent to each other to form a first row along the transparent planar structure,
a second subset of two or more of the plurality of photovoltaic cells linearly disposed adjacent to each other to form a second row along the transparent planar structure, and
a third subset of two or more of the plurality of photovoltaic cells linearly disposed adjacent to each other to form a third row along the transparent planar structure;
wherein the first row and the second row of the pattern are parallel and adjacent to each other with no photovoltaic cells in between the first row and the second row, and
wherein the second row and the third row of the pattern are parallel and adjacent to each other with no photovoltaic cells in between the second row and the third row; and
wherein a distance separating the first row and the second row of the pattern is shorter than a distance separating the second row and the third row of the pattern, so that a space between the third row and the second row of the pattern is greater than a space between the first row and the second row of the pattern.

2. The photovoltaic film of claim 1, wherein the plurality of photovoltaic cells are configured to produce a single electrical output.

3. The photovoltaic film of claim 1, wherein the plurality of photovoltaic cells are arranged into a plurality of zones, and wherein each zone of the plurality of zones is configured to produce a respective electrical output.

4. The photovoltaic film of claim 1, wherein the pattern comprises a plurality of dots that vary in diameter.

5. The photovoltaic film of claim 1, wherein each photovoltaic cell of the plurality of photovoltaic cells of the first subset has a circular shape comprising a first diameter, and each photovoltaic cell of the plurality of photovoltaic cells of the third subset has a circular shape comprising a second diameter that is different from the first diameter.

6. The photovoltaic film of claim 1, wherein the pattern comprises a plurality of rectangles that vary in surface area.

7. The photovoltaic film of claim 1, wherein each photovoltaic cell of the plurality of photovoltaic cells of the first subset has a rectangular shape comprising a first surface area, and each photovoltaic cell of the plurality of photovoltaic cells of the third subset has a rectangular shape comprising a second surface area that is different from the first surface area.

8. A panel, comprising:
a transparent substrate; and
a plurality of photovoltaic cells affixed to the transparent substrate and arranged to form a pattern;
wherein the pattern comprises:
a first subset of two or more of the plurality of photovoltaic cells linearly disposed adjacent to each other to form a first row along the transparent planar structure,
a second subset of two or more of the plurality of photovoltaic cells linearly disposed adjacent to each other to form a second row along the transparent planar structure, and
a third subset of two or more of the plurality of photovoltaic cells linearly disposed adjacent to each other to form a third row along the transparent planar structure;
wherein the first row and the second row of the pattern are parallel and adjacent to each other with no photovoltaic cells in between the first row and the second row, and the second row and the third row of the pattern are parallel and adjacent to each other with no photovoltaic cells in between the second row and the third row; and
wherein a distance separating the first row and the second row of the pattern is shorter than a distance separating the second row and the third row of the pattern, so that a space between the third row and the second row of the pattern is greater than a space between the first row and the second row of the pattern.

9. The panel of claim 8, wherein the plurality of photovoltaic cells are configured to convert sunlight into electrical energy.

10. The panel of claim 8, wherein the plurality of photovoltaic cells are arranged into a plurality of zones, and wherein each of the zones is configured to produce a respective electrical output.

11. The panel of claim 8, wherein the pattern comprises a plurality of dots that vary in diameter.

12. The panel of claim 11, wherein each photovoltaic cell of the first subset of the plurality of photovoltaic cells has a circular shape comprising a first diameter, and each photovoltaic cell of the third subset of the plurality of photovoltaic cells has a circular shape comprising a second diameter that is less than the first diameter.

13. The panel of claim 8, wherein the pattern comprises a plurality of rectangles that vary in surface area.

14. The panel of claim 13, wherein each photovoltaic cell of the plurality of photovoltaic cells of the first subset has a rectangular shape comprising a first surface area, and each photovoltaic cell of the plurality of photovoltaic cells of the third subset has a rectangular shape comprising a second surface area that is less than the first surface area.

15. The panel of claim 8, wherein the transparent substrate comprises glass.

16. A system, comprising:
   a windowpane;
   a plurality of photovoltaic cells affixed to the windowpane in a pattern, wherein the plurality of photovoltaic cells are configured to convert sunlight into electrical energy; and
   an electrical device that is configured to be powered by the electrical energy;
   wherein the pattern comprises:
      a first subset of two or more of the plurality of photovoltaic cells linearly disposed adjacent to each other to form a first row along the transparent planar structure,
      a second subset of two or more of the plurality of photovoltaic cells linearly disposed adjacent to each other to form a second row along the transparent planar structure, and
      a third subset of two or more of the plurality of photovoltaic cells linearly disposed adjacent to each other to form a third row along the transparent planar structure;
   wherein the first row and the second row of the pattern are parallel and adjacent to each other with no photovoltaic cells in between the first row and the second row, and the second row and the third row of the pattern are parallel and adjacent to each other with no photovoltaic cells in between the second row and the third row; and
   wherein a distance separating the first row and the second row of the pattern is shorter than a distance separating the second row and the third row of the pattern, so that a space between the third row and the second row of the pattern is greater than a space between the first row and the second row of the pattern.

17. The system of claim 16, further comprising:
   an energy storage device that is electrically connected to the plurality of photovoltaic cells.

18. The system of claim 16, wherein the electrical device comprises at least one of a motorized window treatment, a daylight sensor, an occupancy sensor, a window sensor, a glare sensor, a shadow sensor, and a cloudy-day sensor.

19. The system of claim 16, wherein the plurality of photovoltaic cells are configured to produce a single electrical output.

20. The system of claim 16, wherein the plurality of photovoltaic cells are arranged into a plurality of zones, and wherein each of the zones is configured to produce a respective electrical output.

21. The system of claim 16, wherein the pattern comprises a plurality of dots that vary in diameter.

22. The system of claim 16, wherein the pattern comprises a plurality of rectangles that vary in surface area.

* * * * *